United States Patent
Prouty et al.

(10) Patent No.: US 11,646,183 B2
(45) Date of Patent: May 9, 2023

(54) SUBSTRATE SUPPORT ASSEMBLY WITH ARC RESISTANT COOLANT CONDUIT

(71) Applicant: Applied Materials, Inc., Santa Clara, CA (US)

(72) Inventors: Stephen Donald Prouty, San Jose, CA (US); Alvaro Garcia De Gorordo, San Francisco, CA (US); Andreas Schmid, Meyriez (CH); Andrew Antoine Noujaim, Morgan Hill, CA (US)

(73) Assignee: Applied Materials, Inc., Santa Clara, CA (US)

( * ) Notice: Subject to any disclaimer, the term of this patent is extended or adjusted under 35 U.S.C. 154(b) by 160 days.

(21) Appl. No.: 16/825,466

(22) Filed: Mar. 20, 2020

(65) Prior Publication Data
US 2021/0296101 A1    Sep. 23, 2021

(51) Int. Cl.
*H01J 37/32*    (2006.01)
*H01L 21/67*    (2006.01)
*H01L 21/683*   (2006.01)

(52) U.S. Cl.
CPC .... *H01J 37/32798* (2013.01); *H01J 37/3244* (2013.01); *H01J 37/32715* (2013.01);
(Continued)

(58) Field of Classification Search
CPC ............... H01J 37/32798; H01J 3/3244; H01J 37/32715; H01J 21/67069; H01J 21/6833;
(Continued)

(56) References Cited

U.S. PATENT DOCUMENTS

| 3,898,369 A | 8/1975 | Clabburn |
| 5,376,213 A * | 12/1994 | Ueda .................. C23C 16/4586 |
| | | 156/345.27 |

(Continued)

FOREIGN PATENT DOCUMENTS

| EP | 2568497 B1 | 6/2019 |
| JP | H07273175 A | 10/1995 |
| WO | WO-2020236454 A1 * | 11/2020 ............... H05F 3/02 |

OTHER PUBLICATIONS

Caulfield et al. "Reducing Electrostatic Discharge in Semiconductor Fluoropolymer Fluid Handling Systems While Maintaining Chemical Purity" Advanced Materials Handling. Technical Note. https://www.entegris.com/content/dam/web/resources/technical-notes/technote-reducing-esd-8080.pdf (Year: 2016).*

(Continued)

*Primary Examiner* — Ram N Kackar
*Assistant Examiner* — Laureen Chan
(74) *Attorney, Agent, or Firm* — Patterson + Sheridan, LLP

(57) ABSTRACT

Semiconductor chamber components are described herein that includes one or more conduits for carrying a fluid between powered and grounded portions of the chamber component, the conduit configure to be less prone to arcing as compared to conventional components. In one example, a semiconductor chamber component is provided that includes a powered region, a grounded region, and a fluid conduit. The fluid conduit is disposed within the semiconductor chamber component and passes through the powered and grounded regions. The fluid conduit has an end to end electrical resistance of between 0.1 to 100 MΩ.

19 Claims, 11 Drawing Sheets

(52) U.S. Cl.
CPC .. *H01J 37/32724* (2013.01); *H01L 21/67069* (2013.01); *H01L 21/6833* (2013.01); *H01J 2237/002* (2013.01); *H01J 2237/2007* (2013.01); *H01J 2237/334* (2013.01)

(58) Field of Classification Search
CPC ......... H01J 2237/334; H01J 2237/2007; H01J 2237/002; H01J 21/68714; H01J 21/68757; H01J 21/68785; H01J 21/6831; H01J 37/32724; C23C 16/458; C23C 16/4581; C23C 16/4583; C23C 16/4586; C23C 16/463; F16L 9/00; F16L 9/10; F16L 9/125; F16L 9/14; F16L 25/01
See application file for complete search history.

(56) References Cited

U.S. PATENT DOCUMENTS

| | | | |
|---|---|---|---|
| 5,725,675 A * | 3/1998 | Fong | C23C 16/455 118/715 |
| 6,423,178 B1 * | 7/2002 | Ohmi | H01L 21/31116 118/724 |
| 6,558,508 B1 | 5/2003 | Kawakami | |
| 6,949,722 B2 | 9/2005 | Strang et al. | |
| 7,161,121 B1 | 1/2007 | Steger | |
| 7,230,204 B2 | 6/2007 | Mitrovic et al. | |
| 7,465,478 B2 | 12/2008 | Collins et al. | |
| 7,651,583 B2 | 1/2010 | Kent et al. | |
| 8,007,591 B2 | 8/2011 | Hamelin | |
| 9,779,955 B2 | 10/2017 | Lill et al. | |
| 10,283,398 B2 | 5/2019 | Tanaka et al. | |
| 2002/0014894 A1 | 2/2002 | Yonezawa et al. | |
| 2008/0217293 A1 | 9/2008 | Iimuro | |
| 2010/0018648 A1 * | 1/2010 | Collins | H01J 37/32174 156/345.24 |
| 2010/0122774 A1 | 5/2010 | Makabe et al. | |
| 2014/0069584 A1 | 3/2014 | Yang et al. | |
| 2015/0132863 A1 * | 5/2015 | Oohashi | H01L 21/67248 438/5 |
| 2016/0108523 A1 * | 4/2016 | Lee | C23C 16/45561 156/89.11 |
| 2017/0254450 A1 * | 9/2017 | Imamura | F16L 19/043 |
| 2017/0306488 A1 * | 10/2017 | Yao | C23C 16/455 |
| 2018/0076048 A1 | 3/2018 | Gohira et al. | |
| 2018/0197761 A1 | 7/2018 | Ferrara et al. | |
| 2018/0211822 A1 | 7/2018 | Gohira et al. | |
| 2018/0211824 A1 | 7/2018 | Kudo et al. | |
| 2018/0247826 A1 | 8/2018 | Nakaya et al. | |
| 2018/0350561 A1 | 12/2018 | Yamaguchi et al. | |
| 2019/0019714 A1 * | 1/2019 | Kosakai | H01L 21/6833 |
| 2019/0027345 A1 | 1/2019 | Ishikawa et al. | |
| 2019/0035609 A1 | 1/2019 | Tobe | |
| 2019/0337823 A1 * | 11/2019 | Leys | C02F 1/4602 |
| 2021/0074519 A1 | 3/2021 | Isago et al. | |

OTHER PUBLICATIONS

International Search Report and Written Opinion for PCT/US2020/065097 dated Apr. 19, 2021.

* cited by examiner

SUBSTRATE SUPPORT ASSEMBLY WITH ARC RESISTANT COOLANT CONDUIT

BACKGROUND

Field

Embodiments of the present disclosure generally relate to semiconductor chamber components, and more particularly to a substrate support assembly having arc resistant coolant conduit.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufactures demand higher throughput and better device yield and performance from every silicon substrate processed. Some fabrication techniques being explored for next generation devices under current development require processing at cryogenic temperatures. Dry reactive ion etching a substrate uniformly maintained at a cryogenic temperature enables ions to bombard the upward facing surfaces of materials disposed on the substrate with decreased spontaneous etching so that trenches with smooth, vertical sidewalls are formed. Additionally, selectivity of etching one material versus another can be improved at the cryogenic temperature. For example, selectivity between silicon (Si) and silicon dioxide ($SiO_2$) increases exponentially as temperature is decreased.

Operating a substrate support assembly to enable cryogenic temperature processing often relies on the use of coolants circulated through the substrate support assembly. As the conduits used to route the coolant span portions of the substrate support assembly that are both grounded and powered, the coolants must be sufficiently electrically insulative to prevent shorting. However, the flow of coolant within the insulative conduits can cause charge build up on the tubing over time that is sufficient to cause arcing between the conduit and grounded portions of the substrate support assembly. Arcing may cause or contribute to many problems, including the formation of pin holes in the conduit which undesirably allow coolant leakage.

Thus, there is a need for an improved substrate support assembly.

SUMMARY

Semiconductor chamber components are described herein that includes one or more conduits for carrying a fluid between powered and grounded portions of the chamber component, the conduit configure to be less prone to arcing as compared to conventional components.

In one example, a semiconductor chamber component is provided that includes a powered region, a grounded region, and a fluid conduit. The fluid conduit is disposed within the semiconductor chamber component and passes through the powered and grounded regions. The fluid conduit has an end to end electrical resistance of between 0.1 to 100 MΩ, such as 1.0 to 20 MΩ.

In another example, a semiconductor chamber component is disclosed as a substrate support assembly. The substrate support assembly includes an electrostatic chuck (ESC), an ESC base assembly, a ground plate, and a first fluid conduit. The ESC has a support surface and a bottom surface opposite the support surface. The ESC additionally has a chucking electrode. The ESC base assembly supporting the ESC, the ESC base assembly has a base channel. At least one of the ESC and the ESC base assembly includes a powered region of the substrate support assembly. The powered region of the substrate support assembly is configured to receive RF power during a substrate processing operation. The ground plate supports the ESC base assembly. The first fluid conduit passes through the powered region and the ground plate. The first fluid conduit has an end to end electrical resistance of between 0.1 to 100 MΩ, such as 1.0 to 20 MΩ.

In yet another example, a substrate support assembly is provided that includes an electrostatic chuck (ESC), an ESC base assembly, a ground plate, and first and second fluid conduits. The ESC has a support surface and a bottom surface opposite the support surface. The ESC also has a chucking electrode and a heater. The ESC base assembly supports the ESC and has a base channel. The ESC base assembly is configured to be RF powered during a substrate processing operation. The ground plate supports the ESC base assembly. The first and second fluid conduits extend from the ground plate to the base channel. The first fluid conduit provides an inlet for flowing heat transfer fluid into the base channel, while the second fluid conduit provides an outlet for flowing heat transfer fluid out of the base channel. The first and second fluid conduits are fabricated from partially conductive ceramic, and have an end to end electrical resistance of between 0.1 to 100 MΩ, such as 1.0 to 20 MΩ.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 2A' is a partial sectional schematic view of an alternative example of a tube disposed in the substrate support assembly illustrated in FIG. 2A.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly which enables a cryogenic temperature operation of an electrostatic chuck (ESC) so that a substrate disposed thereon is maintained at a cryogenic processing temperature suitable for processing while other surfaces of a processing chamber are maintained at a different temperature. The cryogenic processing temperature (i.e., temperature of the substrate) is intended to refer to temperatures less than −10 degrees Celsius at the substrate support.

Also described herein is a substrate support assembly that includes one or more conduits for carrying a fluid within the substrate support assembly between powered and grounded portions of the substrate support assembly which is less prone to arcing. As the conduits described herein are less prone to arcing as compared to conduits used in conventional substrate support assemblies, the reliability, service interval and service life of the substrate support assembly is significantly improved. Although the arc resistant conduit is primarily described as embodied in a substrate support assembly configured to enable cryogenic temperature operation, the arc resistant conduit may be utilized in other substrate support assemblies or other semiconductor processing chamber component in which fluid is transferred in a conduit traversing grounded and powered portions of processing chamber component.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where processing a substrate maintained at the cryogenic processing temperature is desirable. It is to be noted however, that the substrate support assemblies and chamber components described herein may be utilized at other processing temperatures.

Figure 1:
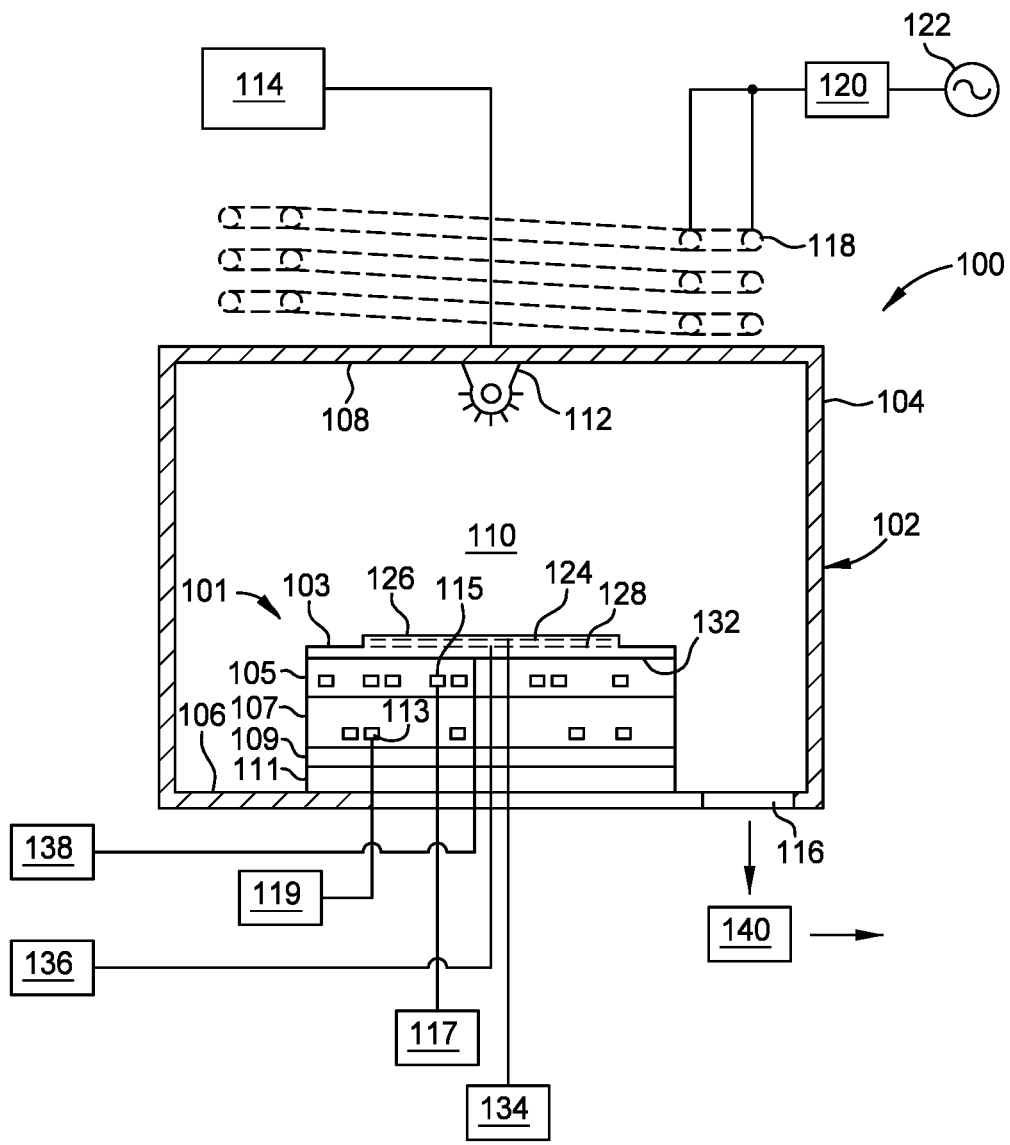
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 101. As mentioned above, the substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems where the ability to uniformly maintain a surface or workpiece, such as a substrate 124, at a cryogenic processing temperature is desirable. Dry reactive ion etching a substrate 124 maintained at a cryogenic processing temperature enables ions to bombard the upward facing surfaces of materials disposed on the substrate 124 with decreased spontaneous etching so that trenches with smooth, vertical sidewalls are formed. For example, diffusion of ions in porosities of a low-k dielectric material disposed on the substrate 124 uniformly maintained at the cryogenic processing temperature is decreased while ions continue to bombard the upward facing surface of the low-k dielectric material to form trenches with smooth, vertical sidewalls. Additionally, selectivity of etching one material versus another can be improved at the cryogenic processing temperature. For example, selectivity between silicon (Si) and silicon dioxide ($SiO_2$) increases exponentially as temperature is decreased.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Process gases, along with any processing by-products, are removed from the processing region 110 through an exhaust port 116 formed in the sidewalls 104 or bottom 106 of the chamber body 102. The exhaust port 116 is coupled to a pumping system 140, which includes throttle valves and pumps utilized to control the vacuum levels within the processing region 110.

The process gases may be energized to form a plasma within the processing region 110. The process gases may be energized by capacitively or inductively coupling RF power to the process gases. In the embodiment, which can be combined with other embodiments described herein, depicted in FIG. 1, a plurality of coils 118 are disposed above the lid 108 of the plasma processing chamber 100 and coupled through a matching circuit 120 to an RF power source 122.

The substrate support assembly 101 is disposed in the processing region 110 below the injection apparatus 112. The substrate support assembly 101 includes an ESC 103 and an ESC base assembly 105. The ESC base assembly 105 is coupled to the ESC 103 and a facility plate 107. The facility plate 107 supported by a ground plate 111 is configured to facilitate electrical, cooling, heating, and gas connections with the substrate support assembly 101. The ground plate 111 is supported by the bottom 106 of the processing chamber. An insulator plate 109 insulates the facility plate 107 from the ground plate 111.

The ESC base assembly 105 includes a base channel 115 (further detailed in FIGS. 4A-4D) coupled to a cryogenic chiller 117. The cryogenic chiller 117 provides a base fluid, such as a refrigerant, to the base channel 115 so that the ESC base assembly 105, and consequently, the substrate 124, may be maintained at a predetermined cryogenic temperature. Similarly, the facility plate 107 includes a facility channel 113 (further detailed in FIGS. 2A and 2B) coupled to a chiller 119. The chiller 119 provides facility fluid to the facility channel 113 so that the facility plate 107 is maintained a predetermined temperature. In one example, the base fluid maintains the ESC base assembly 105 at a temperature greater than a temperature of the facility plate 107.

Figure 2A:
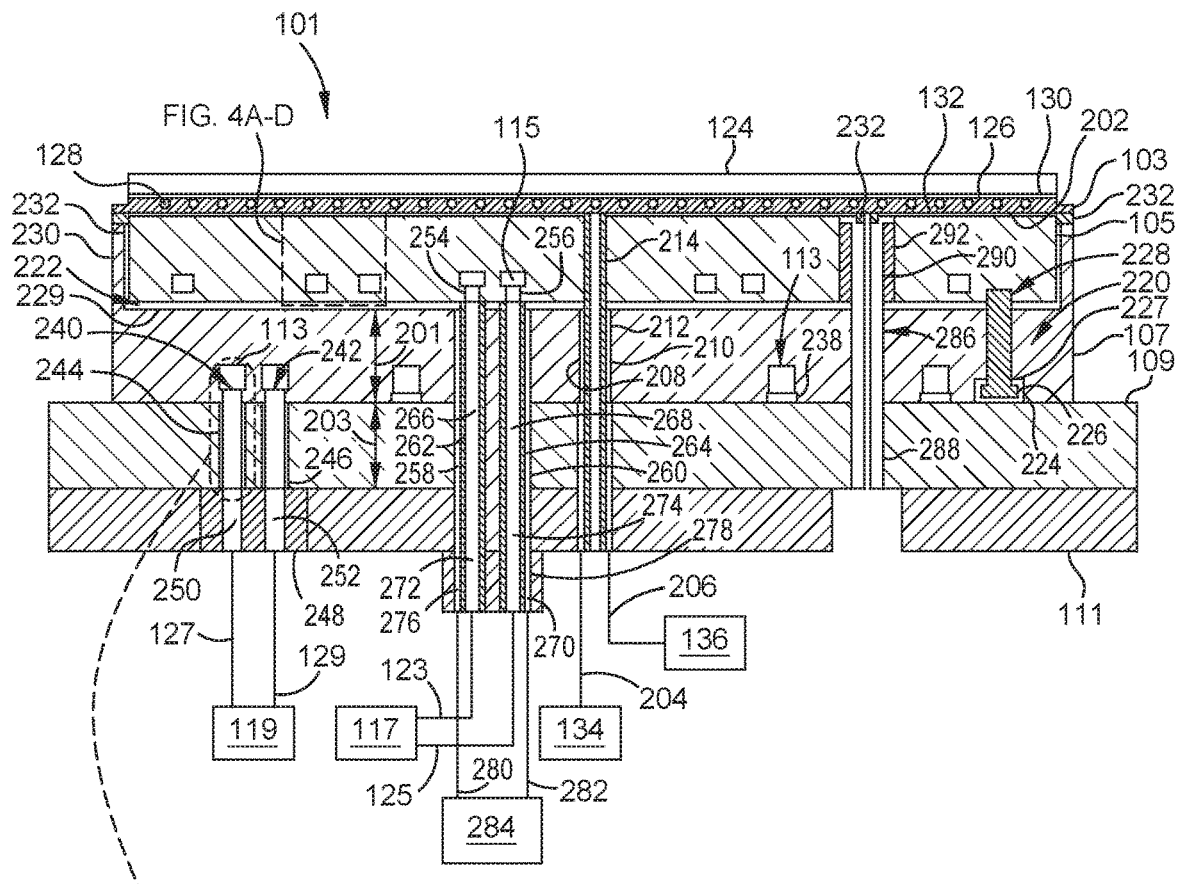
FIG. 2A are cross-sectional schematic view of an exemplary substrate support assembly according to an embodiment.
Figure 2A:
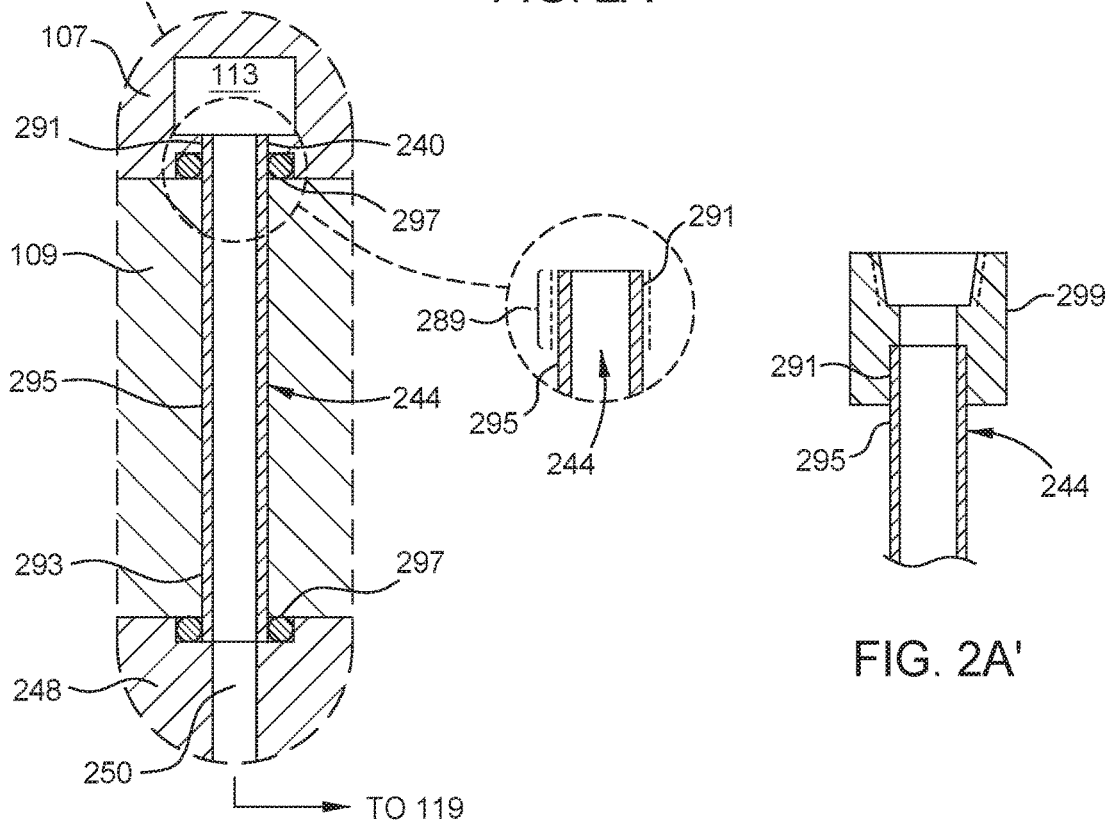
Figure 2B:
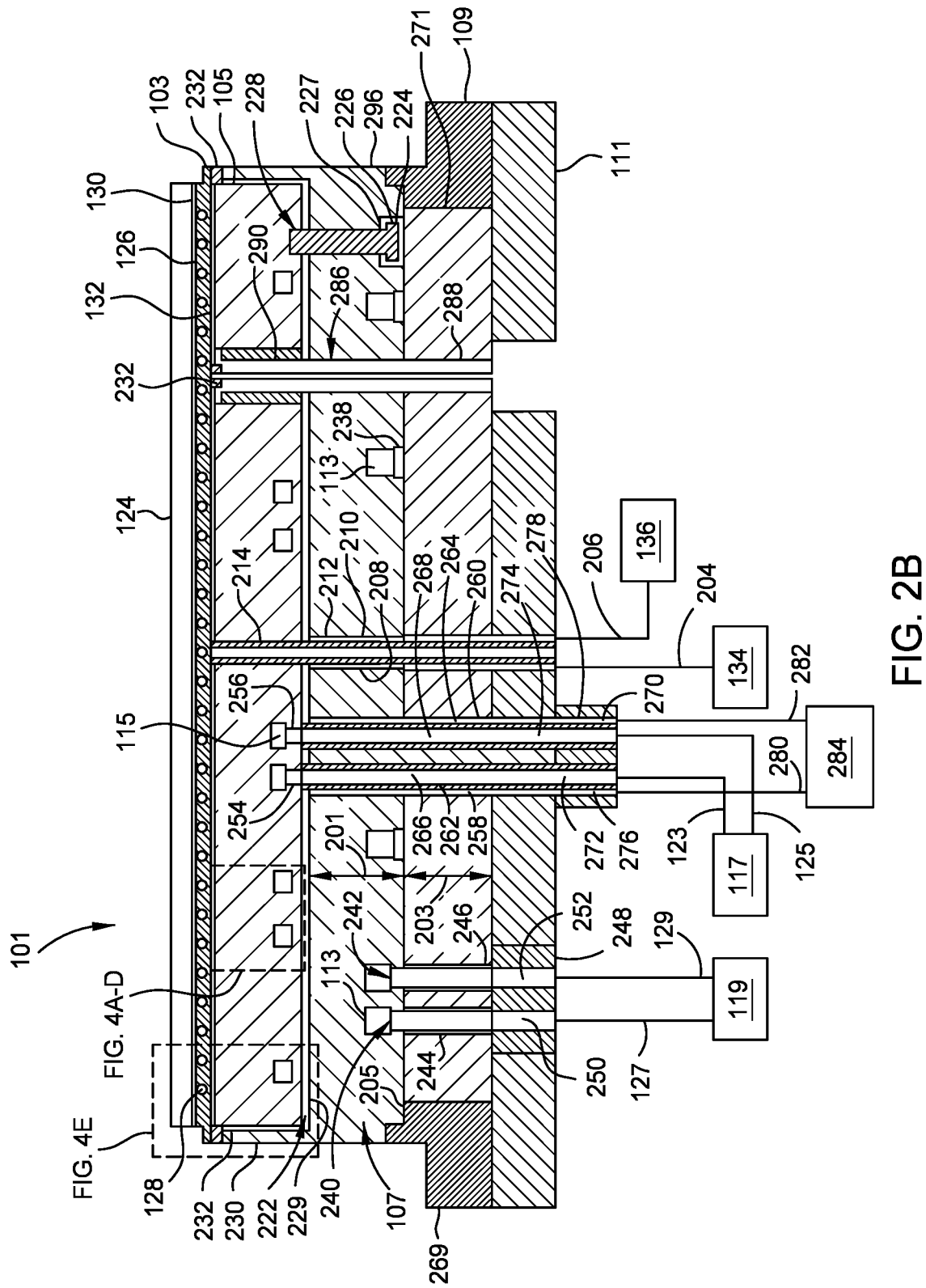
FIG. 2B is a cross-sectional schematic view of an exemplary substrate support assembly according to an embodiment.

Referring additionally to FIGS. 2A-2B, the cryogenic chiller 117 is in fluid communication with the base channel 115 via a base inlet conduit 123 connected to an inlet 254 of the base channel 115 and via a base outlet conduit 125 connected to an outlet 256 of the base channel 115 such that the ESC base assembly 105 is maintained at a predetermined cryogenic temperature. In one embodiment, which can be combined with other embodiments described herein, the cryogenic chiller 117 is coupled to an interface box to control a flow rate of a base fluid. The base fluid comprises a composition that remains a liquid a cryogenic temperature less than −50 degrees Celsius at operating pressures. The base fluid is generally insulative so that an electrical path is not formed through the base fluid when circulated through the substrate support assembly 101. A non-limiting example of suitable facility fluid includes fluorinated heat transfer fluids. The cryogenic chiller 117 provides the base fluid, which is circulated through the base channel 115 of the ESC base assembly 105. The base fluid flowing through the base channel 115 enables the ESC base assembly 105 to be maintained at the cryogenic temperature, which assists in controlling the lateral temperature profile of the ESC 103 so that a substrate 124 disposed on the ESC 103 is uniformly maintained at the cryogenic processing temperature. In one embodiment, which can be combined in other embodiments described herein, the cryogenic chiller 117 is operable to maintain the cryogenic temperature less than about −50 degrees Celsius The chiller 119 is in fluid communication with the facility channel 113 via a facility inlet conduit 127 connected to an inlet 240 of the facility channel 113 and via a facility outlet conduit 129 connected to an outlet 242 of the facility channel 113 such that the facility plate 107 is maintained a predetermined ambient temperature. In one embodiment, which can be combined with other embodiments described herein, the cryogenic chiller 119 is coupled to an interface box to control a flow rate of the facility fluid. The facility fluid may include a material that can maintain an ambient temperature between about −10 degrees Celsius to about 60 degrees Celsius. The chiller 119 provides the facility fluid, which is circulated through the facility channel 113 of the facility plate 107. The facility fluid is generally insulative so that an electrical path is not formed through the facility fluid when circulated through the substrate support assembly 101. A non-limiting example of a suitable facility fluid includes fluorinated heat transfer fluids. The facility fluid flowing through the facility channel 113 enables the facility plate 107 to be maintained at the predetermined ambient temperature, which assists in maintaining the insulator plate 109 at the predetermined ambient temperature.

Returning primarily to FIG. 1, the ESC 103 has a support surface 130 and a bottom surface 132 opposite the support surface 130. In one embodiment, which can be combined with other embodiments described herein, the ESC 103 is fabricated from a ceramic material, such as alumina ($Al_2O_3$), aluminum nitride (AlN) or other suitable material. Alternately, the ESC 103 may be fabricated from a polymer, such as polyimide, polyetheretherketone, polyaryletherketone and the like.

The ESC 103 includes a chucking electrode 126 disposed therein. The chucking electrode 126 may be configured as a mono polar or bipolar electrode, or other suitable arrangement. The chucking electrode 126 is coupled through an RF filter and the facility plate 107 to a chucking power source 134, which provides a DC power to electrostatically secure the substrate 124 to the support surface 130 of the ESC 103. The RF filter prevents RF power utilized to form a plasma (not shown) within the plasma processing chamber 100 from damaging electrical equipment or presenting an electrical hazard outside the chamber.

The ESC 103 includes one or more resistive heaters 128 embedded therein. The resistive heaters 128 are utilized to control the temperature of the ESC 103, which is cooled by the ESC base assembly 105, such that cryogenic processing temperatures suitable for processing a substrate 124 disposed on the support surface 130 of the substrate support assembly 101 may be maintained. The resistive heaters 128 are coupled through the facility plate 107 and an RF filter to a heater power source 136. The RF filter prevents RF power utilized to form a plasma (not shown) within the plasma processing chamber 100 from damaging electrical equipment or presenting an electrical hazard outside the chamber. The heater power source 136 may provide 500 watts or more power to the resistive heaters 128. The heater power source 136 includes a controller (not shown) utilized to control the operation of the heater power source 136, which is generally set to heat the substrate 124 to a predetermined cryogenic temperature. In one embodiment, which can be combined with other embodiments described herein, the resistive heaters 128 include a plurality of laterally separated heating zones, wherein the controller enables at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 maintain the substrate 124 at a cryogenic processing temperature suitable for processing. In one embodiment, which can be combined with other embodiments described herein, the cryogenic processing temperature is less than about −10 degrees Celsius. For example, the cryogenic processing temperature is between about −10 degrees Celsius to about −150 degrees Celsius.

The substrate support assembly 101 may include one or more temperature probe assemblies disposed therein. The one or more temperature assemblies are utilized to provide feedback to balance the heating and cooling provided by the ESC base assembly 105 and the resistive heaters 128 of the ESC 103 so that a desired substrate processing temperature may be maintained.

Figure 5A:
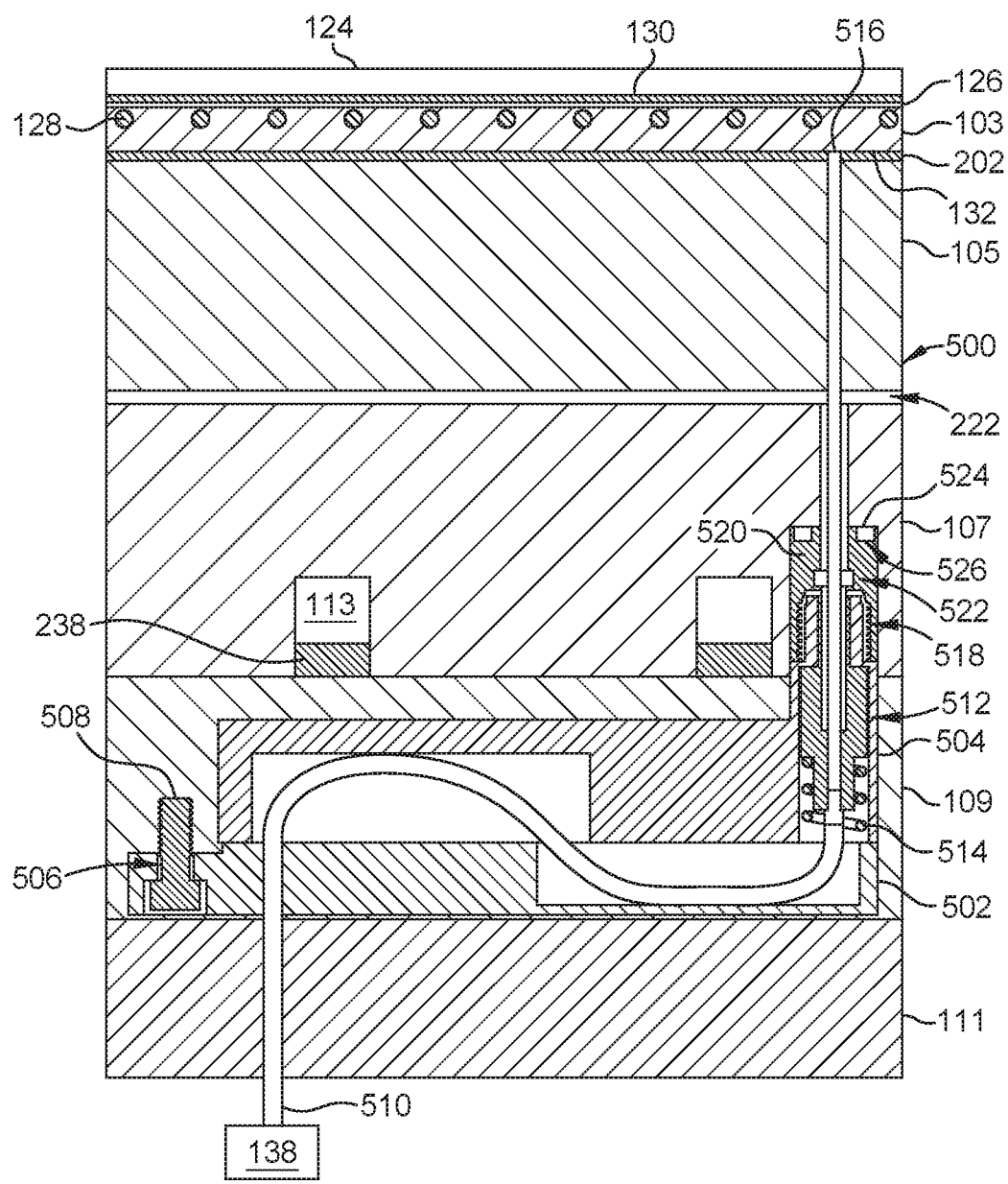
FIGS. 5A-5C are sectional, cross-sectional schematic views of an exemplary substrate support assembly according to embodiments.
Figure 5B:
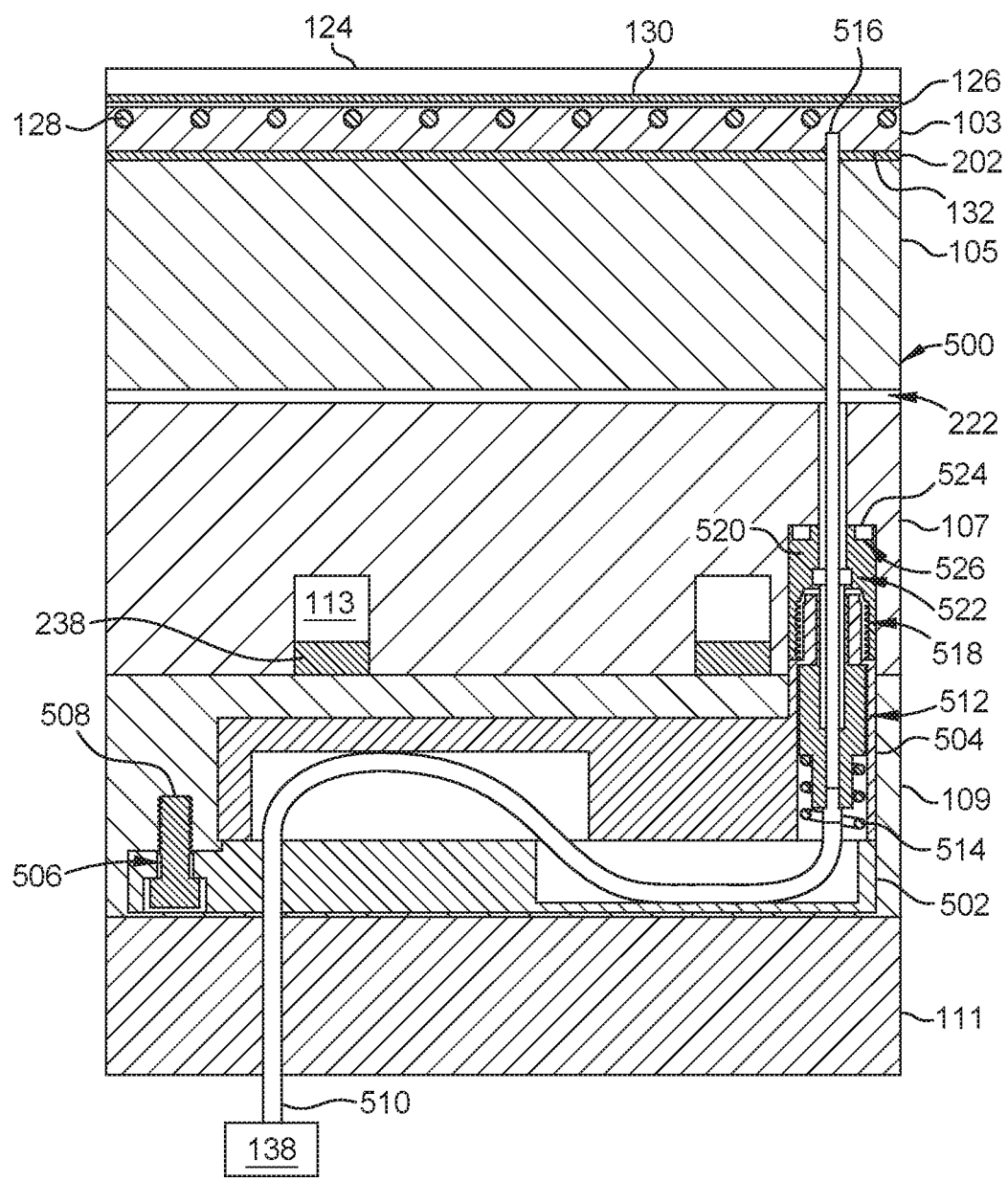
Figure 5C:
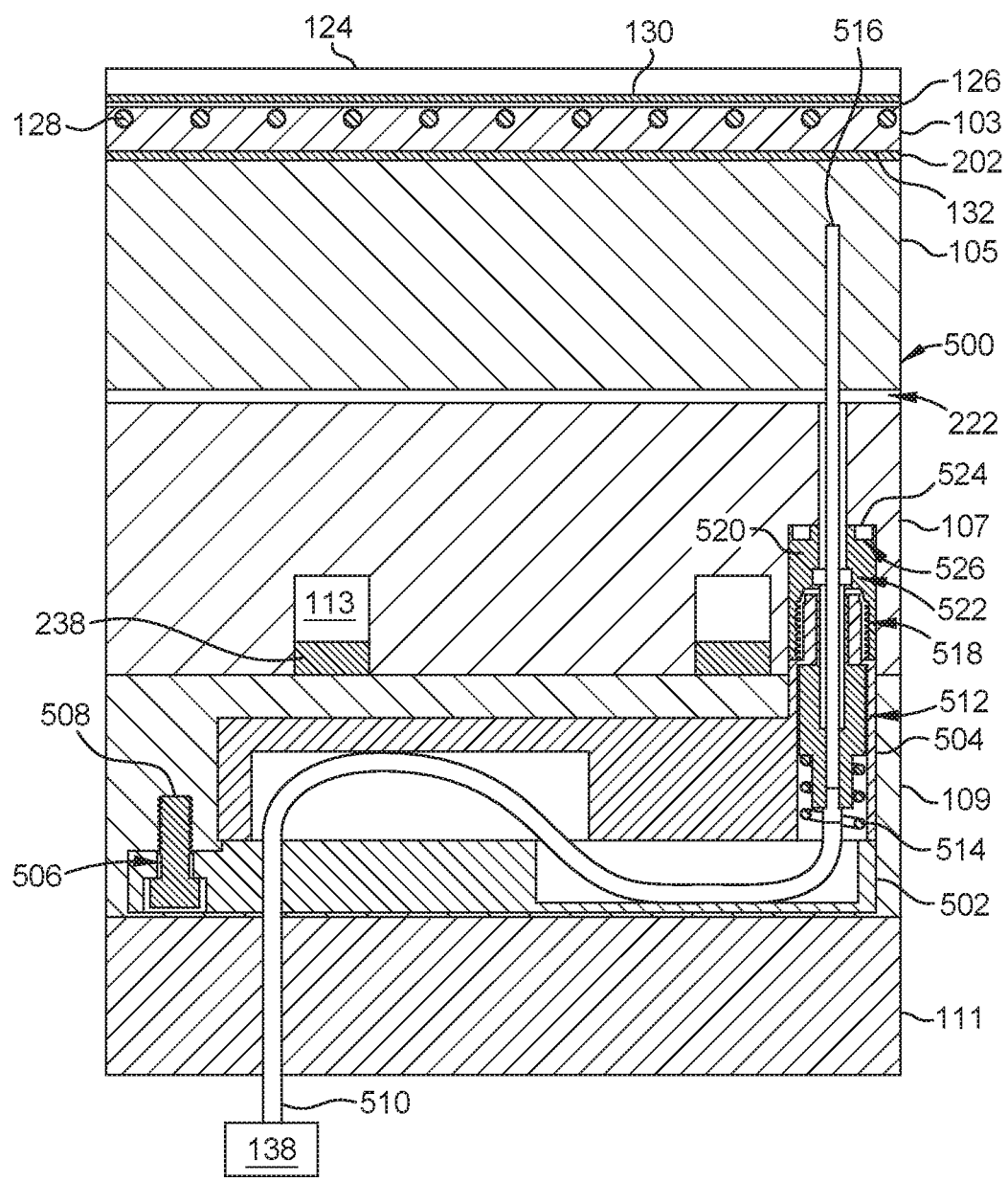

Various low temperature optical probe assemblies 500, which can be combined with other embodiments described herein, are shown in FIGS. 5A-5D coupled to a probe controller 138. In one embodiment, which can be combined with other embodiments described herein, the probe tip 516 of each of low temperature optical probes 512 is disposed in (as shown in FIG. 5B) or at the surface of the ESC 103 (as shown in FIG. 5A) to determine the temperature of the ESC 103. In another embodiment, which can be combined with other embodiments described herein, probe tip 516 of each of low temperature optical probes 512 is disposed in (as shown in FIG. 5C) the ESC base assembly 105 to infer the temperature of the substrate based on the temperature of the ESC base assembly 105. In one embodiment, which can be combined with other embodiments described herein, each of low temperature optical probe assemblies 500, only one of which is shown, corresponds to a zone of the plurality of laterally separated heating zones of the resistive heaters 128, wherein the low temperature optical probes measure the temperature of each zone of the ESC 103. The probe controller 138 is coupled to the heater power source 136 so that each zone of the resistive heaters 128 is independently heated for the lateral temperature profile of the ESC 103 to be substantially uniform based on temperature measurements so that a substrate 124 disposed on the ESC 103 is uniformly maintained at the cryogenic processing temperature.

Referring back to FIGS. 2A and 2B, the exemplary substrate support assembly 101 is configured to enable cryogenic temperature operation of ESC 103 so that a substrate 124 disposed thereon is maintained at the cryogenic processing temperature. The ESC 103 is coupled to the ESC base assembly 105. In one embodiment, which can be combined with other embodiments described herein, the ESC 103 is secured to the ESC base assembly 105 with a bonding layer 202. The bonding layer 202 may include organic or inorganic materials. In some embodiments, which may be combined with other embodiments described herein, the bonding layer 202 may include epoxy or metal materials. The chucking electrode 126 is coupled to the chucking power source 134 via a first insulated wire 204 disposed through a first bore 208 in a lower insulator 212 of the facility plate 107 and an upper insulator 214 of the ESC base assembly 105. The one or more resistive heaters 128 are coupled to the heater power source 136 via a second insulated wire 206 disposed through a second bore 210 in the lower insulator 212 of the facility plate 107 and the upper insulator 214 of the ESC base assembly 105.

Figure 2C:
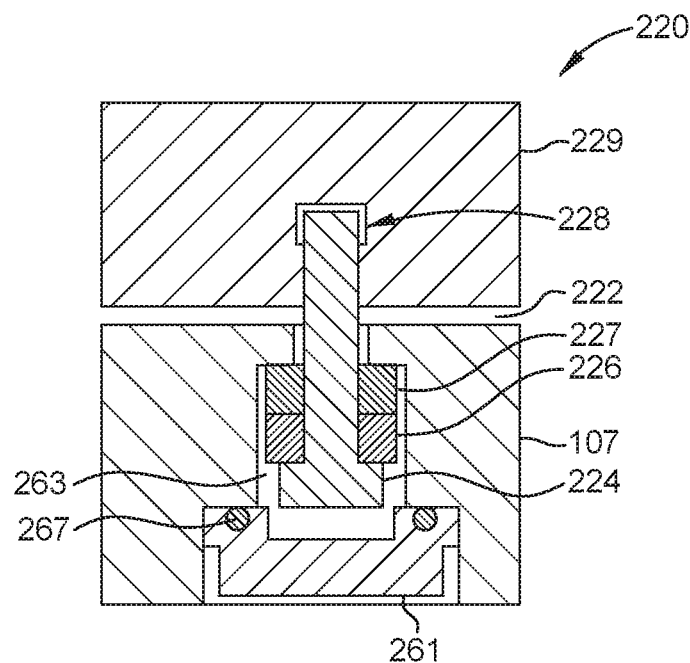
FIG. 2C is a schematic view of a screw assembly according to an embodiment.

The facility plate 107 includes a plate portion 229 and wall portion 230. The plate portion 229 of the ESC base assembly 105 is coupled to the facility plate 107 with one or more first screw assemblies 220 so that a vacuum region 222 is present between the ESC base assembly 105 and the facility plate 107. Each of the one or more first screw assemblies 220 includes a bolt 224 inserted through a thermal break 227 contacting the facility plate 107, biasing element 226, and facility plate 107, and into a thread hole 228 of ESC base assembly 105. The thermal break 227 is in contact with the facility plate 107 to provide thermal isolation from the ESC base assembly 105 maintained at the cryogenic temperature. In one embodiment, which can be combined with other embodiments described herein, the thermal break 227 includes a polyamide-imide (PAI) or polyimide (PI) containing material. The biasing element 226 is utilized to generate a force when compressed. Suitable biasing elements 226 includes coil springs, spring forms, and elastomers. In one example, the biasing element 226 is illustrated as a plurality of Belleville washers. The biasing element 226 is compressed by tightening the bolt 224, so that the facility plate 107 is forced (i.e., pre-loaded) against the ESC base assembly 105. In some embodiments, as shown in FIG. 2C, a screw cover 261 is coupled to the facility plate 107 over the bolt 224 such that a vacuum insulation region 263 is maintained between each of the one or more first screw assemblies 220. The screw cover 261 is coupled to the facility plate 107 by a seal 267 to maintain the pressure in the vacuum insulation region 263 and to thermally insulate each of the one or more first screw assemblies 220 from the facility plate 107. In operation, the ESC base assembly 105 is generally maintained in an RF hot condition.

The facility plate 107 includes a wall portion 230 coupled to the ESC 103 by a seal 232. In one embodiment, which can be combined with other embodiments described herein, the lower insulator 212 of the facility plate 107 maintains the vacuum region 222 via the seal 232. The wall portion 230 coupled to the ESC by the seal 232 protects the materials of the ESC base assembly 105 from potentially corrosion and/or erosion from contact with process gases. The vacuum region 222 is defined by the ESC 103, ESC base assembly 105, facility plate 107, and seal 232. The vacuum region 222 prevents condensation on the backside of the cooling plate, prevents process gases from entering the substrate support assembly 101 by having a pressure independent of the pressure of the processing region 110, and provides for thermal isolation between the ESC base assembly 105 and facility plate 107. In one embodiment, which can be combined with other embodiments described herein, the facility plate 107 includes aluminum containing materials.

The facility channel 113 of the facility plate 107 is machined in the facility plate and seal with a cover 238. In one example, the cover 238 is welded to the facility plate 107 to seal the facility channel 113. The inlet 240 of the facility channel 113 is in fluid communication with an inlet conduit 244 disposed through the insulator plate 109 and the ground plate 111. The outlet 242 of the facility channel 113 is in fluid communication with an outlet conduit 246 disposed through the insulator plate 109 and the ground plate 111. The inlet conduit 244 and outlet conduit 246 are connected to a connection 248 having a connection inlet 250 connected to the facility inlet conduit 127 and a connection outlet 252 connected to the facility outlet conduit 129. In operation, the facility plate 107 is generally maintained in an RF hot condition.

As discussed above, the inlet conduit 244 and the outlet conduit 246 spans powered and grounded portions of the substrate support assembly 101. That is, the inlet conduit 244 and the outlet conduit 246 extend between the powered facility plate 107 and the ESC base assembly 105 (i.e., the powered portions) and the grounded insulator plate 109 and the ground plate 111 (i.e., the grounded portions) of the substrate support assembly 101. To discourage static charges from accumulating on the conduits 244, 246 while the insulative facility fluid passes through the conduits 244, 246, the conduits 244, 246 are fabricated to be sufficiently conductive so that static charges sufficient to cause arcing within the substrate support assembly 101 are not accumulated on the surfaces of the conduits 244, 246 while still preventing shorting between the grounded and powered portions, here the insulator plate 109 and the ESC base assembly 105, of the substrate support assembly 101. Thus, this configuration of the conduits 244, 246 substantially prevents arcing between the conduits 244, 246 grounded portion of the substrate support assembly 101, which advantageously increases the reliability, service interval and service life of the substrate support assembly 101. In one example, which can be combined with other examples described herein, the conduit 244 is fabricated from a material compatible with the facility fluid, and having an end to end resistance of between about 0.1 MOhm and about 100 MOhm. For example, the end to end resistance of the conduit 244 may be between about 1.0 MOhm and about 50 MOhm, such as between about 1.0 MOhm and about 20 MOhm. Non-limiting examples of materials suitable for fabricating the conduit 244 include SiC, Ti doped alumina, carbon doped plastic, and metal doped ceramics, among other materials.

As illustrated in the enlarged portion of FIG. 2A, the conduit 244 includes a first end 291 and a second end 293. The conduit 244 also has outer surface 295 connecting the 291, 293. The outer surface 295 at each of the ends 291, 293 includes a sealing surface 289. The sealing surface 289 is polished to facilitate sealing with the facility plate 107 and the connection 248. In one example, the outer surface 295 at each of the ends 291, 293 is polished to at least 32 μin RA or smoother, such as between about 4 to 8 μin RA. A seal 297 may be disposed between the polished sealing surface 289 of the outer surface 295 and the facility plate 107 and the connection 248 to prevent leakage. In one example, the seal 297 may be configured as described with reference to the seal 232, or in another suitable manner. Alternatively, a fitting 299 (shown FIG. 2A') may be sealingly coupled to outer surface 295 at each of the ends 291, 293. The fitting 299 is configured to sealing mate with a complimentary mating surface (for example, a male/female thread, compression fitting, brazing ring, and the like) of the facility plate 107 and/or the connection 248. In one example, the fitting 299 may be a metal cylinder that is brazed to the conduit 244 and to the facility plate 107 at one end 291, while a second fitting 299 is brazed to the conduit 244 and to the connection 248 at the other end 293. Although the seal 297 is illustrated and described as a piston seal, the seal 297 may alternatively be configured as a face seal.

The conduits 246, 266, 268 may also be fabricated as described above, for example having ends as described with reference to FIG. 2A'. The conduits 244, 246, 266, 268 may also be configured as a sleeve that is inserted in an electrically insulative backing tube that provides mechanical strength to the conduit.

Figure 6:
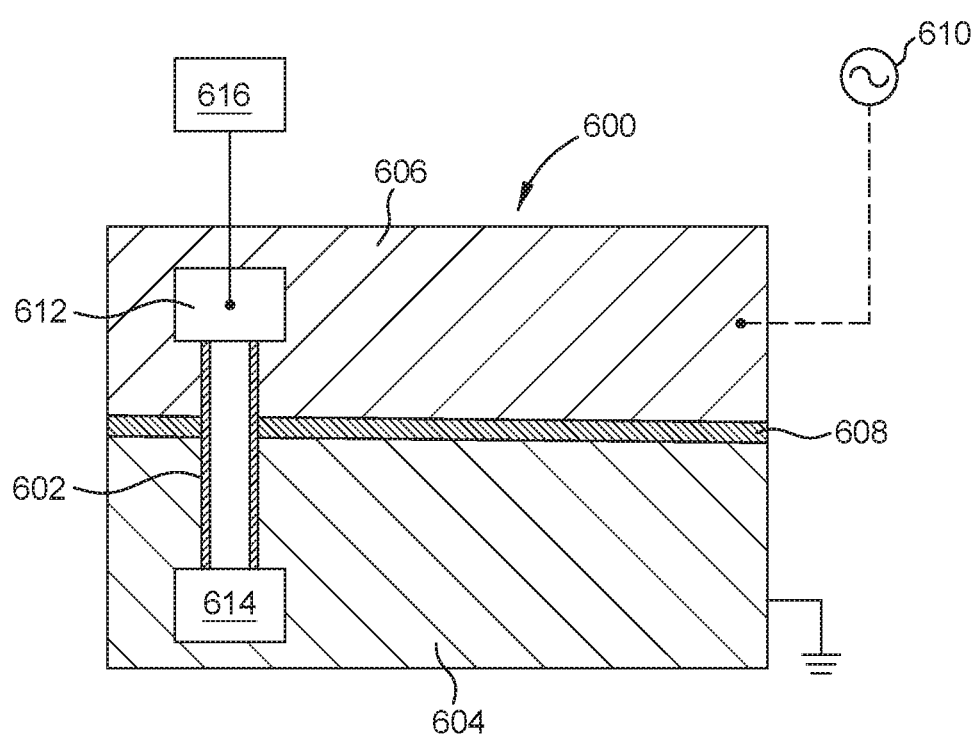
FIG. 6 is a cross-sectional schematic view of a semiconductor chamber component having an internal conduit that spans grounded and powered regions of the chamber component.

Also as indicated above and schematically illustrated in FIG. 6, other semiconductor chamber components 600 in addition to substrate support assemblies, such as showerheads, electrostatic chucks, gas distribution plates, heat shields, and removable process kits having an internal conduit 602 that passes between a grounded region 604 and a powered region 606, may have the conduit 602 fabricated as described herein with reference to the conduit 244. The powered region 606 is configured to be DC and/or RF hot by application of power, for example via a power source 610, or through exposure to a plasma within a processing chamber in which the semiconductor chamber component 600 is utilized during substrate processing. The grounded region 604 and the powered region 606 may optionally be separated by an insulating layer 608. The insulating layer 608 may be a polymer layer, ceramic layer, a bonding layer or other non-electrically conductive suitable layer. In one example, the grounded region 604 is configured similar to the ground plate 111, while the powered region 606 is configured to include the facility plate 107 or the ESC base assembly 105 or ESC 103.

The conduit 602 is coupled to two channels 612, 614. The channels 612, 614 may be internally confined within the regions 604, 606, such as a heat transfer fluid conduit, or may be exposed to the exterior of the component 600, such as a gas flow hole disposed through component 600. In one example, the channel 612 is coupled to a fluid source 616, such as a gas panel, backside gas source, processing gas source, purge gas source, or heat transfer fluid source, among others.

Returning to FIGS. 2A-2B, the base channel 115 of the ESC base assembly 105, described in greater detail in FIGS. 4A-4D, includes an inlet 254 of the base channel 115 in fluid communication with an jacketed inlet conduit 258 disposed through the facility plate 107, the insulator plate 109, and the ground plate 111. The outlet 256 of the base channel 115 is in fluid communication with a jacketed outlet conduit 260 disposed through the facility plate 107, the insulator plate 109, and the ground plate 111. The jacketed inlet conduit 258 and jacketed outlet conduit 260 are connected to an interface block 270. In one embodiment, which can be combined with other embodiments described herein, the interface block 270 is fabricated from stainless steel. The jacketed inlet conduit 258 includes a fluid inlet conduit 266 and a vacuum channel 262. The jacketed outlet conduit 260 includes a fluid outlet conduit 268 and a vacuum channel 264. The interface block 270 includes a base inlet 272, a vacuum channel 276, a base outlet 274, and a vacuum channel 278. The base inlet 272 connects the fluid inlet conduit 266 to the base inlet conduit 123. The base outlet 274 connects the fluid outlet conduit 268 to the base outlet conduit 125. The vacuum channel 276 is connected to a vacuum conduit 280 in fluid communication with a vacuum source 284 and the vacuum channel 278 is connected to a vacuum conduit 282 in fluid communication with the vacuum source 284. Coupling the vacuum source 284 to the vacuum region 222 enables a pressure independent of the pressure of the processing region 110 to be maintained in the vacuum region 222. In one embodiment, which can be combined with other embodiments described herein, the fluid inlet conduit 266 and the fluid outlet conduit 268 are coupled to the ESC base assembly 105 by the seal 232 to maintain the pressure in the vacuum region 222.

The substrate support assembly 101 also includes one or more lift pin assemblies 286 for accommodating lift pins (not shown) for elevating the substrate 124 above the support surface 130 of the ESC 103 to facilitate robotic transfer into and out of the plasma processing chamber 100. Each of the one or more lift pin assemblies 286 includes a lift pin guide 288 disposed through the ESC 103, the ESC base assembly 105, the facility plate 107, the insulator plate 109, and the ground plate 111. A portion 290 of the lift pin guide 288 disposed through the ESC base assembly 105 is surrounded by a threaded bushing 292 holding the lift pin guide 288 in position. The lift pin guide 288 is coupled to the ESC 103 by the seal 232 to maintain the chamber vacuum and insulation vacuum separate. In one embodiment, which can be combined with other embodiments described herein, the ESC 103 includes one or more gas passages for providing backside heat transfer gas, such as helium, to an interstitial space defined between the substrate 124 and the support surface 130 of the ESC 103. Each of the one or more one or more gas passages is disposed through the ESC 103, the ESC base assembly 105, the facility plate 107, the insulator plate 109, and the ground plate 111. Each of the one or more gas passages is coupled to the ESC 103 by the seal 232 to maintain the pressure in the vacuum region 222.

As shown in FIG. 2B, the facility plate 107 includes a recessed portion 296 and a seal 297 disposed between the insulator plate 109 and the facility plate 107. A surface 205 of the insulator plate 109 coupled to the facility plate 107 is conformal to the facility plate 107. The recessed portion 296 and the insulator plate 109 provide for a decreased thickness 201 of the facility plate 107 and an increased thickness 203 of the insulator plate 109. In one embodiment, which can be combined with other embodiments described herein, an outer portion 269 of the insulator plate 109 includes materials different than the materials of the inner portion 271 of the insulator plate 109. The outer portion 269 may include aluminum oxide ($AlO_2$) containing materials and the inner portion 271 of the insulator plate 109 may include polystyrene containing materials.

Figure 3:
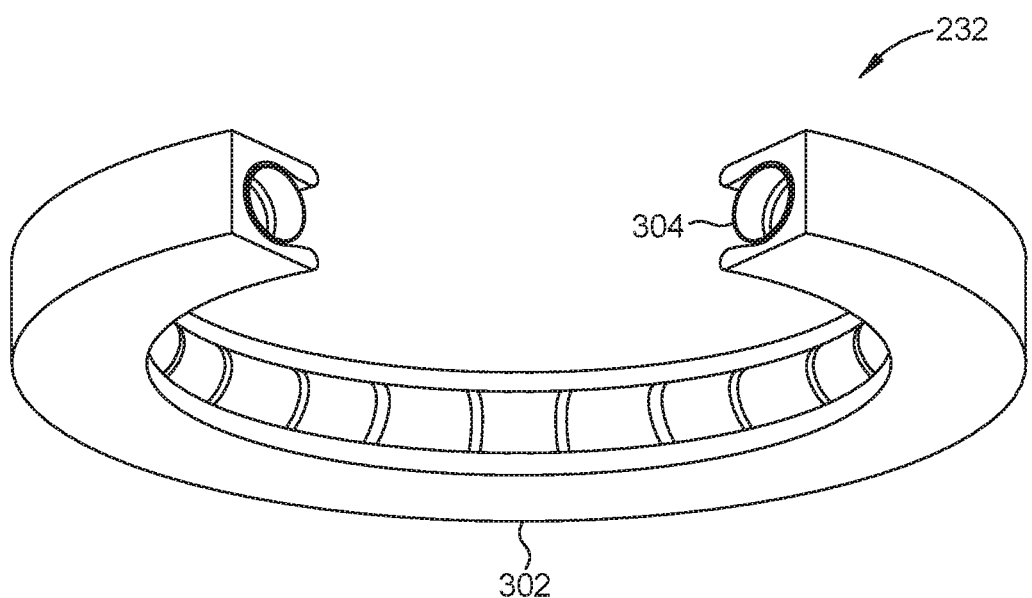
FIG. 3 is a schematic view of a seal according to an embodiment.

FIG. 3 is a schematic view of the seal 232 according to an embodiment. While FIG. 3 shows the seal 232 as a face seal, embodiments described herein may include piston (i.e., radial) seals having a polytetrafluoroethylene (PTFE) body, metal seals, or other suitable seal. The seal 232 may by an elastomeric or metal seal suitable for low temperature use. The seal 232 may additionally include a biasing element, such as a spring or spring form, to energize the seal 232 so that sufficient compression of the seal 232 is maintained for robust low temperature operation, as described herein. The seal 232 described herein provide for sealing of the vacuum region 222 at a temperature between about −260 degrees Celsius to about 290 degrees Celsius. The seal 232, shown in FIG. 3, includes a PTFE body 302 having a spring 304 disposed therein. In one embodiment, which can be combined with other embodiments described herein, the spring 304 may be fabricated from stainless steel, nickel alloy, nickel-chromium alloy, cobalt-chromium-nickel-molybdenum alloy containing materials or other suitable spring material. The seal 232 allows for sealing of the ESC 103 at cryogenic temperatures. In one example, the seal 232 includes a PTFE body 302 and a spring 304 disposed therein and has a safe operation range of between about −260 degrees Celsius to about 290 degrees Celsius.

Figure 4A:
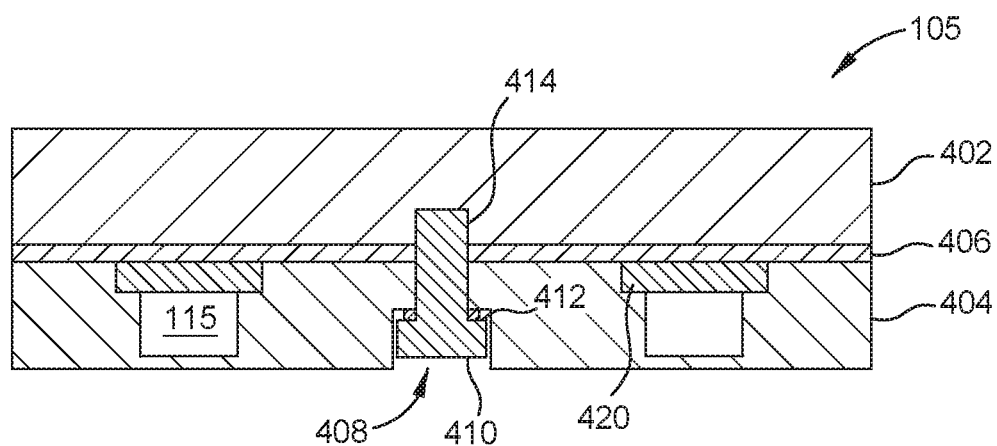
FIGS. 4A-4D are cross-sectional schematic views of an ESC base assembly according to embodiments.
Figure 4B:
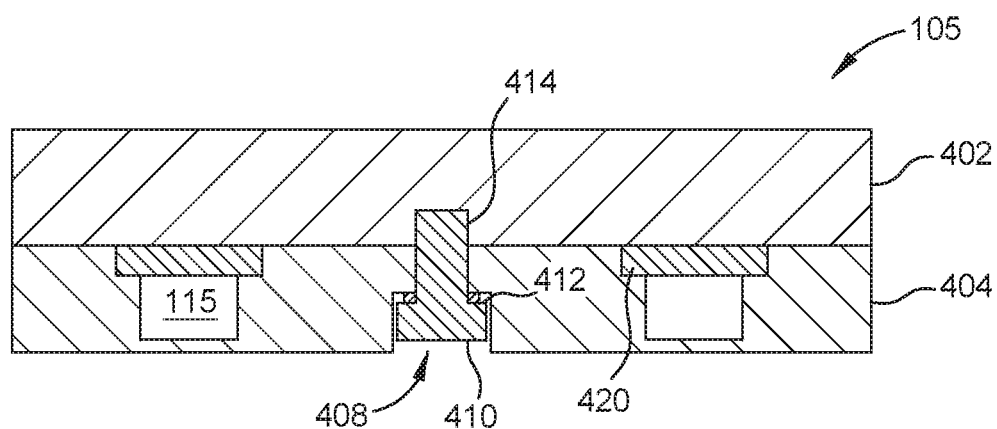

FIGS. 4A and 4B are cross-sectional schematic views of the ESC base assembly 105 having an ESC base 402 coupled to a base channel plate 404. The ESC base 402 includes materials to substantially match the coefficient of thermal expansion of the ESC 103. The ESC base 402 may include molybdenum or carbon fiber containing materials. In one embodiment, which can be combined with other embodiments described herein, the base channel plate 404 consists of aluminum containing materials. The base channel plate 404 includes the base channel 115 of the ESC base assembly 105. The base channel 115 is machined in the base channel plate 404 and bonded, welded, or brazed with a cover 420. The inlet 254 of the base channel 115 is in fluid communication with the jacketed inlet conduit 258 and the outlet 256 of the base channel 115 is in fluid communication with the jacketed outlet conduit 260. The ESC base 402 is coupled to the base channel plate 404 via one or more second screw assemblies 408. In one embodiment, as shown in FIG. 4A, the ESC base 402 is coupled to the base channel plate 404 with a thermal conductive gasket 406 therebetween to maintain a defined thermal conductivity between the ESC base 402 and the base channel plate 404. In another embodiment, as shown in FIG. 4B, a thermal conductive gasket 406 is not included. Each of the one or more second screw assemblies 408 includes a bolt 410 inserted through one or more Belleville washers 412 and ESC base 402, and into a thread hole 414 of ESC base 402. The one or more Belleville washers 412 and bolt 410 are preloaded such that the base channel plate 404 is forced against the ESC base 402.

Figure 4C:
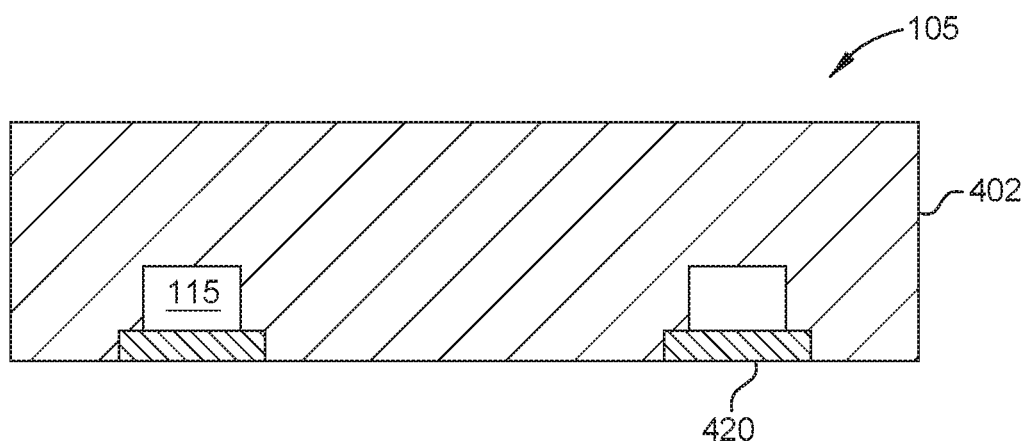

FIG. 4C is a cross-sectional schematic view of the ESC base assembly 105 having an ESC base 402 with the base channel 115. The ESC base 402 includes molybdenum or carbon fiber containing materials to substantially match the coefficient of thermal expansion of the ESC 103. The base channel 115 is machined in the ESC base 402 and bonded, welded, or brazed with a cover 420. The inlet 254 of the base channel 115 is in fluid communication with the jacketed inlet conduit 258 and the outlet 256 of the base channel 115 is in fluid communication with the jacketed outlet conduit 260.

Figure 4D:
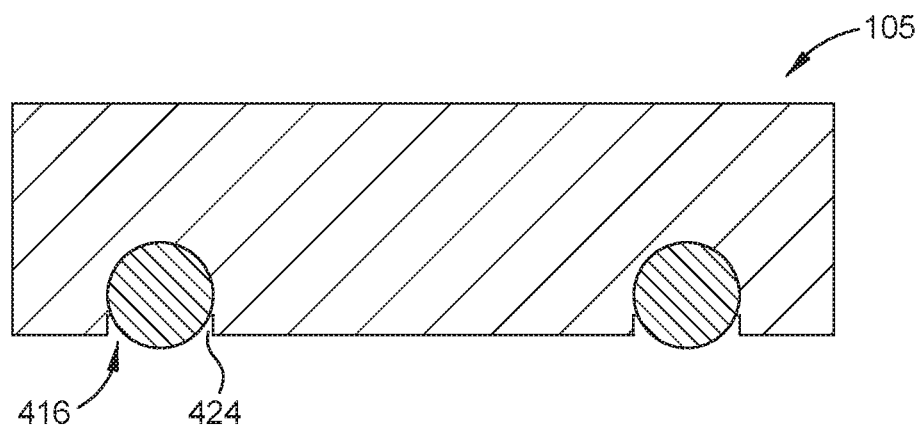

FIG. 4D is a cross-sectional schematic view of the ESC base assembly 105 having an ESC base 402 with the base channel 115. The ESC base 402 includes molybdenum or carbon fiber containing materials to substantially match the coefficient of thermal expansion of the ESC 103. The base channel 115 is a coil 416 disposed in a space 424 machined in the ESC base 402. The inlet 254 of the base channel 115 is in fluid communication with the jacketed inlet conduit 258 and the outlet 256 of the base channel 115 is in fluid communication with the jacketed outlet conduit 260.

Figure 4E:
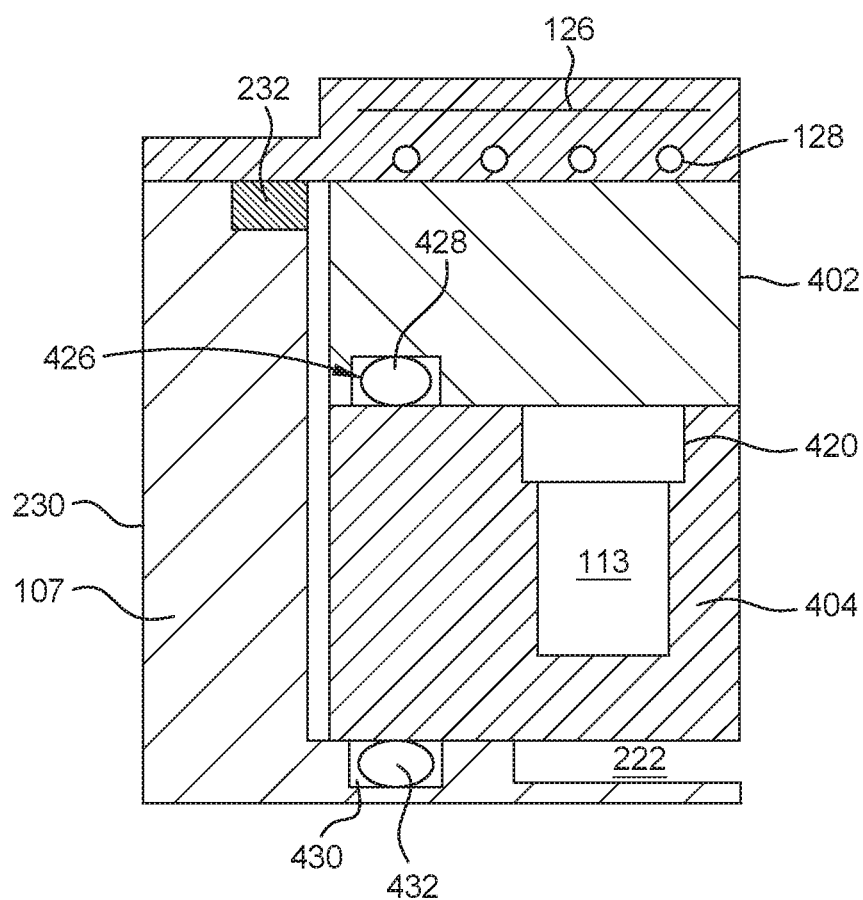
FIG. 4E is a cross-sectional schematic view of a perimeter portion of an exemplary substrate support assembly according to an embodiment.

FIG. 4E is a cross-sectional schematic view of a perimeter portion of the substrate support assembly 101 of FIG. 2B. The ESC base 402 includes a groove 426 exposed to the vacuum region 222. The groove 426 includes a RF gasket 428 disposed therein. The plate portion 229 of the facility plate 107 includes a groove 430 with a RF gasket 432 disposed therein. While the ESC base 402 and base channel plate 404 are thermally isolated from the facility plate 107, the RF gasket 432 maintains RF connectivity between the base channel plate 404 and the facility plate 107. Similarly, while the ESC base 402 and base channel plate 404 may be thermally conducting by the thermal interface in the embodiment shown in FIG. 4A and FIG. 4E, the RF gasket 428 maintains an electrical, RF connectivity between the base channel plate 404 and the ESC base 402.

Figure 5D:
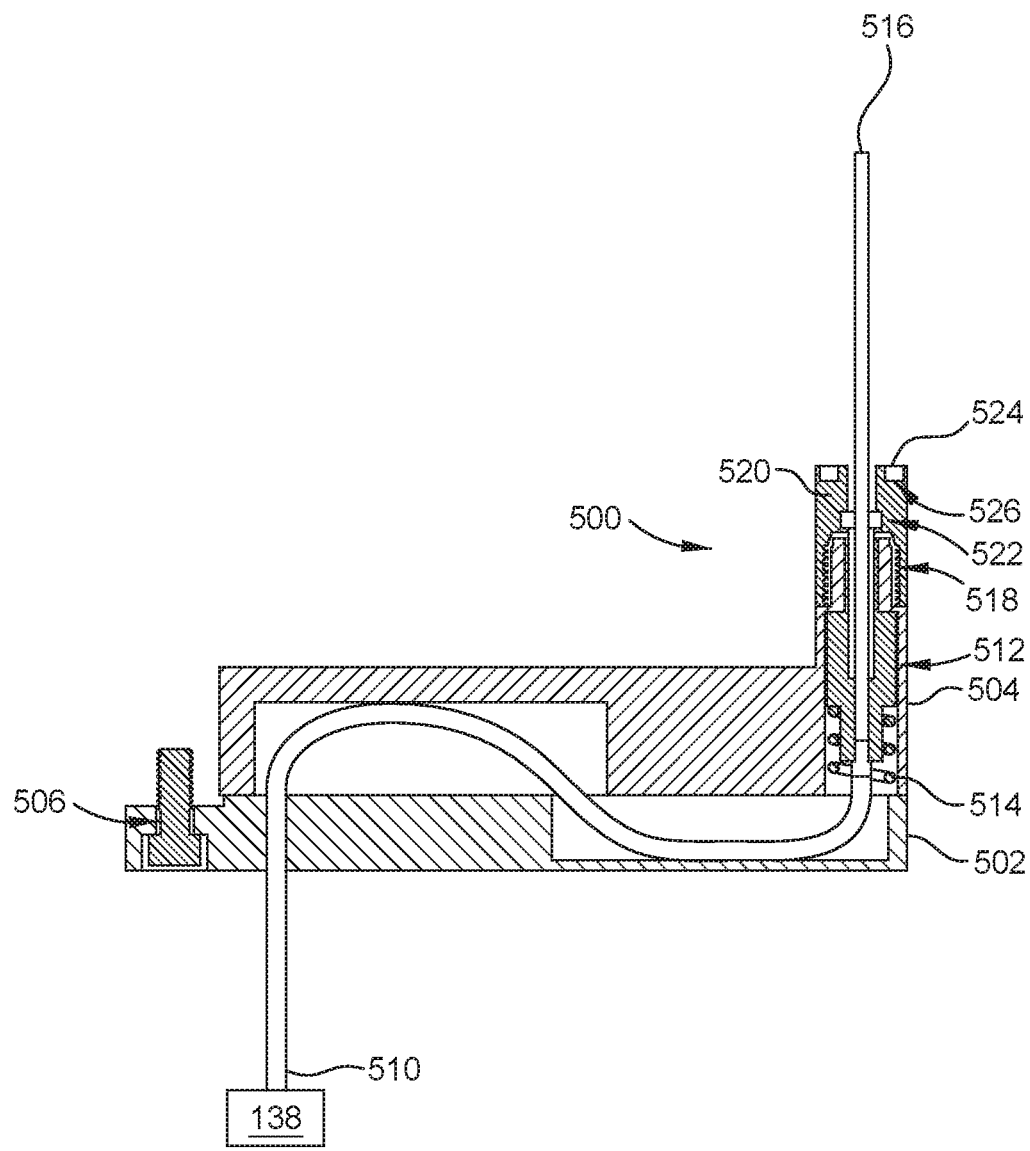
FIG. 5D is a cross-sectional schematic view of a low temperature optical probe assembly according to an embodiment.

FIGS. 5A-5C are schematic cross-sectional schematic view of an exemplary substrate support assembly 101 having one of the one or more low temperature optical probe assemblies 500 (shown in FIG. 5D). Each of the low temperature optical probe assemblies 500 includes an optical fiber 510 connected to the probe controller 138. Each of the low temperature optical probe assemblies 500 includes a mount housing 502 disposed in the insulator plate 109 and a probe housing 504 disposed in the insulator plate 109 and facility plate 107. The mount housing 502 is coupled to the probe housing 504 with a probe mounting bolt 506 inserted through the mount housing 502 and into a thread hole 508 of the insulator plate 109 so that the probe assembly 500 is forced against the facility plate 107. The optical fiber 510 is connected to a low temperature optical probe 512 disposed in the probe housing 504. The probe housing 504 includes a spring 514 to provide for vertical movement of the low temperature optical probe 512 so that a probe tip 516 of the low temperature optical probe 512 is configured to contact the ESC 103. In one embodiment, which can be combined with other embodiments described herein, the probe tip 516 contacts ESC 103 without penetrating the surface. In another embodiment, which can be combined with other embodiments described herein, shown in FIG. 5B, the probe tip 516 is disposed within ESC 103. In the facility plate 107, a threaded cap 518 surrounds the probe housing 504. The internal portion 520 of the threaded cap 518 is coupled to the probe housing 504 with an internal seal 522. The internal seal 522 allows the probe tip 516 to maintain contact the ESC 103. In one embodiment, which can be combined with other embodiments described herein, the internal seal 522 is the seal 232. In another embodiment, which can be combined with other embodiments described herein, the internal seal 522 is an elastomer seal. In yet another embodiment, which can be combined with other embodiments described herein, the internal seal 522 is an O-ring or other suitable seal. The external portion 524 of the threaded cap 518 is coupled to the facility plate 107 with an external seal 526. The external seal 526 seals the probe housing 504 from the vacuum region 222. In one embodiment, which can be combined with other embodiments described herein, the external seal 526 is an O-ring or other suitable seal.

In summation, a substrate support assembly that enables cryogenic temperature operation of an ESC so that a substrate disposed thereon is maintained at the cryogenic processing temperature while other surfaces of a processing chamber are maintained at a different temperature is provided. The substrate support assembly is disposed in the process chamber, including an ESC 103, an ESC base assembly 105 coupled to the ESC 103 and a facility plate 107, and an insulator plate 109 coupled to a ground plate 111. A base fluid flowing through the base channel of the ESC base assembly 105 coupled to the ESC 103, in conjunction with resistive heaters 128, enables the ESC base assembly 105 to be maintained at a predetermined cryogenic temperature, which assists in controlling the lateral temperature profile of the ESC 103 so that a substrate 124 disposed on the ESC 103 is uniformly maintained at a cryogenic processing temperature. The facility fluid flowing through the facility channel 113 of the facility plate 107 enables the facility plate 107 to be maintained at the ambient temperature, which assists in maintaining the insulator plate 109 and ground plate 111 at the ambient temperature.

Additionally, a semiconductor chamber component, such as substrate support assembly, showerhead, or heat shield, among others, has been described that advantageously extends the life of internal conduits that carry a fluid between powered and grounded portions of the semiconductor chamber component. The arc resistant characteristic of the conduit beneficially extends the reliability, service interval and service life of the semiconductor chamber component. As illustrated in FIGS. 1-5 the arc resistant conduit can beneficially be utilized in substrate support assemblies flowing electrically insulative heat transfer fluids.

While the foregoing is directed to examples of the present disclosure, other and further examples of the disclosure may be devised without departing from the basic scope thereof, and the scope thereof is determined by the claims that follow.

What is claimed is:

1. A semiconductor chamber component comprising:
   a powered region comprising:
      a first plate having fluid channels;
   a grounded region comprising:
      a second plate;
   an insulator plate coupling the powered region to the grounded region; and
   a fluid conduit disposed within the semiconductor chamber component and passing through the insulator plate and having a first end in the first plate and a second end in the second plate, wherein the fluid conduit is configured to provide a heat transfer fluid to the fluid channels, the fluid conduit comprising:
      an end to end electrical resistance of between 0.1 to 100 MΩ from the first end to the second end.

2. The semiconductor chamber component of claim 1, wherein the end to end electrical resistance is between 1.0 to 50 MΩ.

3. The semiconductor chamber component of claim 1, wherein the end to end electrical resistance is between 1.0 to 20 MΩ.

4. The semiconductor chamber component of claim 2, wherein the fluid conduit is fabricated from at least one material selected from the group consisting of SiC, Ti doped alumina, carbon doped plastic, and metal doped ceramics.

5. The semiconductor chamber component of claim 4, wherein the fluid conduit further comprises:
   an outer surface that is polished proximate at least one end of the fluid conduit to a finish of 32 RA (µin) or smoother.

6. The semiconductor chamber component of claim 5, wherein the powered and grounded regions comprise portions of a substrate support assembly, a showerhead, electrostatic chuck, a gas distribution plate, a heat shield, or a removable process kit.

7. The semiconductor chamber component of claim 1, wherein the fluid conduit is fabricated from at least one material selected from the group consisting of SiC, Ti doped alumina, carbon doped plastic, and metal doped ceramics.

8. The semiconductor chamber component of claim 1, wherein the fluid conduit further comprises:
   an outer surface that is polished proximate at least one end of the fluid conduit to a finish of 32 RA (µin) or smoother.

9. The semiconductor chamber component of claim 1, wherein the fluid conduit further comprises:
   an outer surface that is polished proximate at least one end of the fluid conduit to a finish of between 4 to 8 RA (µin).

10. The semiconductor chamber component of claim 1, wherein the fluid conduit further comprises:
    a fitting coupled to the first end of the fluid conduit, the fitting configured for sealingly coupling to a complimentary mating surface in the first plate.

11. The semiconductor chamber component of claim 1, wherein the powered and grounded regions comprise portions of a substrate support assembly, a showerhead, electrostatic chuck, a gas distribution plate, a heat shield, or a removable process kit.

12. A substrate support assembly comprising:
    an electrostatic chuck (ESC) having a support surface and a bottom surface opposite the support surface, the ESC having a chucking electrode;
    an ESC base assembly supporting the ESC, the ESC base assembly having a base channel, at least one of the ESC and the ESC base assembly comprising a powered region of the substrate support assembly, the powered region of the substrate support assembly configured to receive RF power during a substrate processing operation;
    a ground plate supporting the ESC base assembly; and
    a first fluid conduit having a first end in the ESC base assembly and a second end disposed in the ground plate, the first fluid conduit having an end to end electrical resistance of between 0.1 to 100 MΩ.

13. The substrate support assembly of claim 12, wherein the end to end electrical resistance is between 1.0 to 50 MΩ.

14. The substrate support assembly of claim 12, wherein the first fluid conduit is fabricated from at least one material selected from the group consisting of SiC, Ti doped alumina, carbon doped plastic, and metal doped ceramics.

15. The substrate support assembly of claim 12, wherein the first fluid conduit further comprises:
    an outer surface that is polished proximate at least one end of the first fluid conduit to a finish of between 4 to 8 RA (µin).

16. The substrate support assembly of claim 12, wherein the first fluid conduit further comprises:
    a fitting coupled to the first end of the first fluid conduit, the fitting configured for sealingly coupling to a complimentary mating surface of the ESC base assembly.

17. The substrate support assembly of claim 12 further comprising:
    a facility plate disposed between the ESC base assembly and the ground plate, the facility plate having a facility channel configured to circulate a facility fluid; and
    a second fluid conduit is sealingly coupled to the facility channel, the second fluid conduit having an end to end electrical resistance of between 0.1 to 100 MΩ.

18. The substrate support assembly of claim 12 further comprising:
    a second fluid conduit comprising an end to end electrical resistance of between 0.1 to 100 MΩ, wherein the first and second fluid conduits are coupled to a base channel disposed in the ESC base assembly, the base channel configured to flow a refrigerant therethrough.

19. A substrate support assembly comprising:
an electrostatic chuck (ESC) having a support surface and a bottom surface opposite the support surface, the ESC having a chucking electrode and a heater;
an ESC base assembly supporting the ESC, the ESC base assembly having a base channel, the ESC base assembly configured to be RF powered during a substrate processing operation;
a ground plate supporting the ESC base assembly;
a first fluid conduit extending from the ground plate to the base channel, the first fluid conduit providing an inlet for flowing heat transfer fluid into the base channel; and
a second fluid conduit extending from the ground plate to the base channel, the second fluid conduit providing an outlet for flowing heat transfer fluid out of the base channel, the first and second fluid conduits fabricated from at least one material selected from the group consisting of SiC, Ti doped alumina, carbon doped plastic, and metal doped ceramics, and the first and second fluid conduits each having an end to end electrical resistance of between 0.1 to 100 MΩ.

\* \* \* \* \*